United States Patent [19]

Tateyama et al.

[11] Patent Number: 5,421,056
[45] Date of Patent: Jun. 6, 1995

[54] SPIN CHUCK AND TREATMENT APPARATUS USING SAME

[75] Inventors: Kiyohisa Tateyama, Kumamoto; Michiaki Matsushita, Yatsushiro, both of Japan

[73] Assignees: Tokyo Electron Limited, Tokyo; Tokyo Electron Kyushu Limited, Tosu, both of Japan

[21] Appl. No.: 229,675

[22] Filed: Apr. 19, 1994

[30] Foreign Application Priority Data

Apr. 19, 1993 [JP] Japan .................. 5-116390

[51] Int. Cl.⁶ .......................... H01L 21/304
[52] U.S. Cl. ....................... 15/302; 15/21.1; 15/77; 15/88.2; 15/97.1; 15/102; 15/308; 15/309.1; 134/153; 134/902; 279/106
[58] Field of Search ............... 15/21.1, 77, 88.2, 97.1, 15/102, 302, 308, 309.1, DIG. 14; 134/153, 902; 279/106, 109

[56] References Cited

U.S. PATENT DOCUMENTS

| | | | |
|---|---|---|---|
| 2,613,943 | 10/1952 | Trudeau | 279/106 |
| 2,784,002 | 3/1957 | Stace et al. | 279/106 |
| 2,865,643 | 12/1958 | Parker et al. | 279/106 |
| 4,788,994 | 12/1988 | Shinbara | 134/153 |
| 4,903,717 | 2/1990 | Sumnitsch | 134/153 |
| 4,924,890 | 5/1990 | Giles et al. | 134/902 |
| 5,032,217 | 7/1991 | Tanara | 134/153 |
| 5,156,174 | 10/1992 | Thompson et al. | 134/153 |
| 5,168,886 | 12/1992 | Thompson et al. | 134/153 |

FOREIGN PATENT DOCUMENTS 185029 7/1988 Japan ............... 134/902
3-9607 2/1991 Japan .

*Primary Examiner*—Mark Spisich
*Attorney, Agent, or Firm*—Oblon, Spivak, McClelland, Maier & Neustadt

[57] ABSTRACT

A cleaning apparatus for cleaning a semiconductor wafer comprises a spin chuck having a turn table. A gas supplying passage is formed in a shaft for supporting the turn table to supply a protecting gas to the rear surface of the wafer. A conical movable member, arranged to cover an end off the shaft, is movable upward and downward in accordance with the flow off the protecting gas supplied thereto. Inner ends of three reciprocating arms, supported by the turn table and extending in radial directions, abut against an outer surface of the movable member and biased by springs. Fixed pins are arranged on the turn table at positions which divide the circumference of the turn table into three equal parts, along the edge of the wafer. Three swingable levers are arranged such that one is provided between two adjacent fixed pins. One end of each swingable lever is connected to the outer end of each reciprocating arm and the other end of the lever has a pin brought into contact with the edge of the wafer. When the protecting gas is supplied, the movable member is moved upward to a working position, and the reciprocating arms are pressed by the movable member and moved outward. As a result, the swingable levers are moved so as to bring their pins into contact with the edge of the wafer, thereby clamping the wafer among the pins.

20 Claims, 6 Drawing Sheets

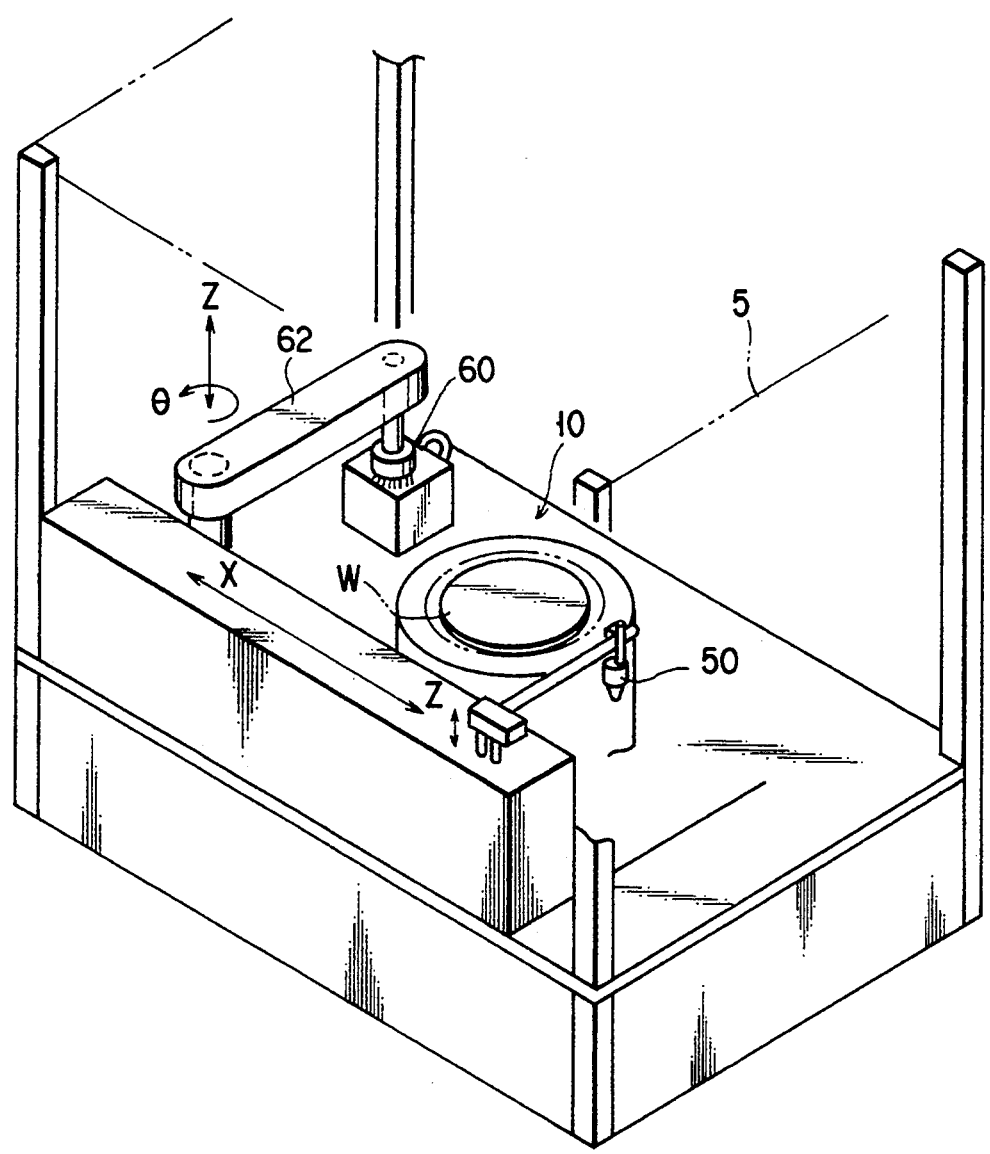
F I G. 1

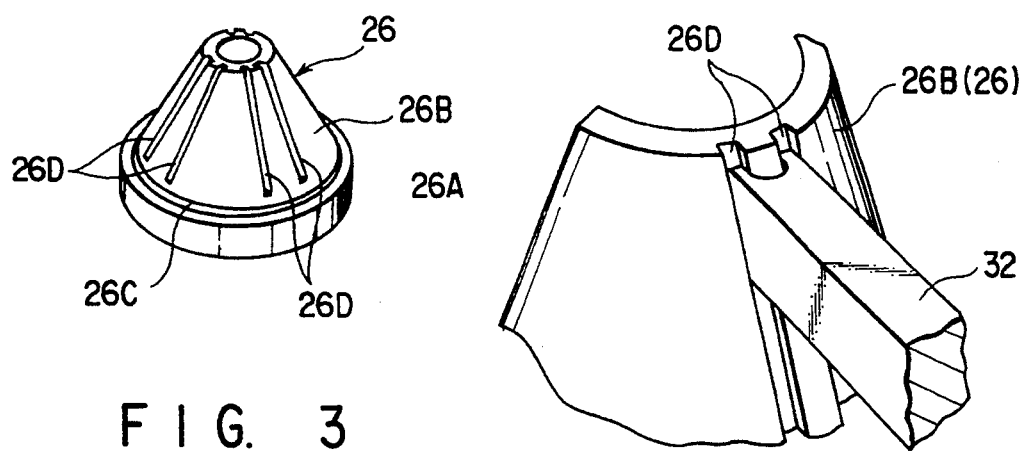
FIG. 3
FIG. 5
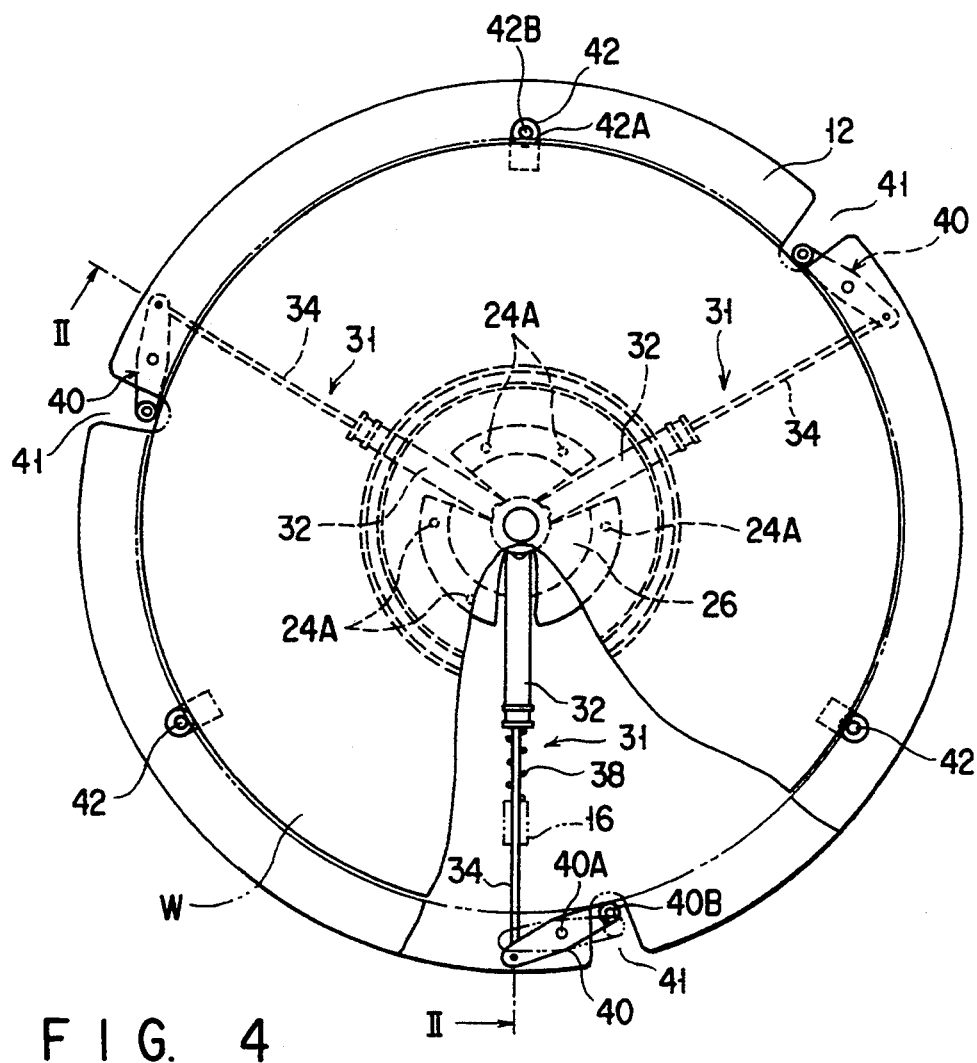
FIG. 4

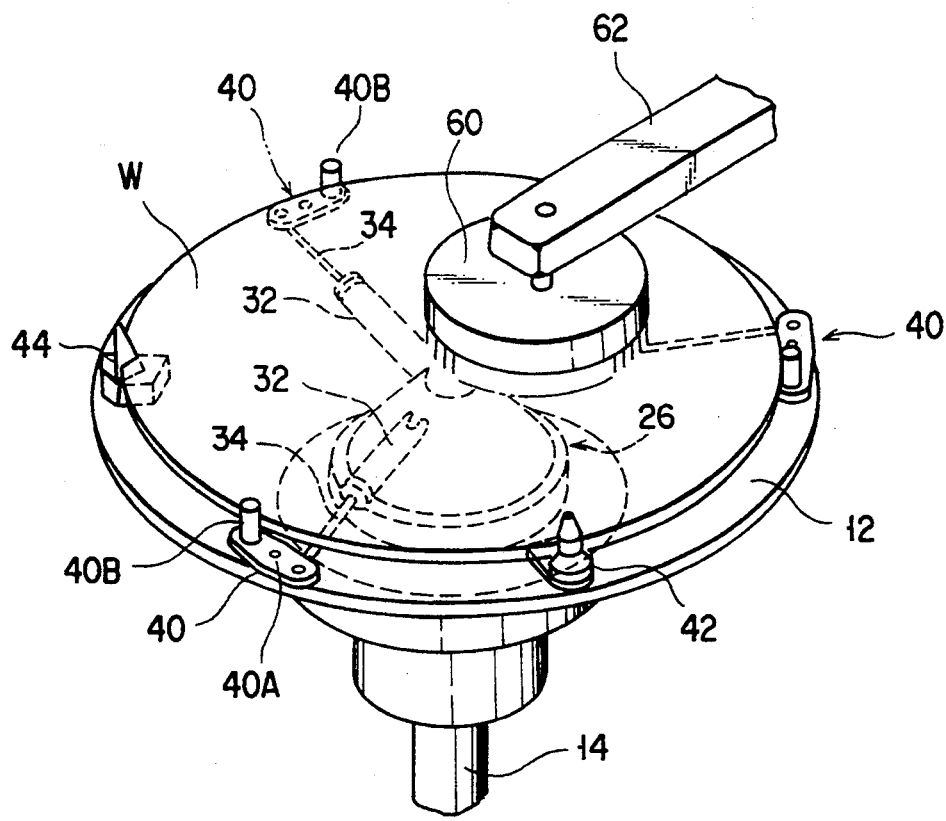
F I G. 7
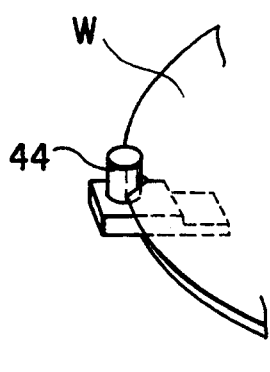
F I G. 8A
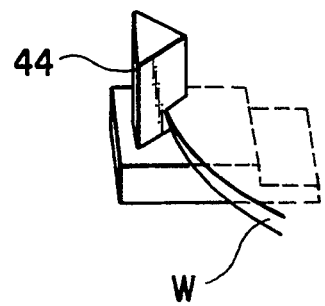
F I G. 8B

SPIN CHUCK AND TREATMENT APPARATUS USING SAME

BACKGROUND OF THE INVENTION

1. Field of the Invention

The present invention relates to a spin chuck for holding and rotating a substrate to be treated, such as a semiconductor wafer or an LCD substrate, and to a treatment apparatus using the spin chuck.

2. Description of the Related Art

An apparatus for cleaning a semiconductor wafer is known as a treatment apparatus using a spin chuck. In this type of cleaning apparatus, a wafer is held in a horizontal position and rotated by the chuck. While the wafer is being rotated, a surface of the wafer is supplied with a cleaning liquid and brushed by a brush made of nylon or mohair. As a result, particle contaminant on the wafer surface is brushed off and removed.

When the main surface of a wafer for forming semiconductor devices is treated, since the rear surface of the wafer is attached to a chuck, the chuck uses a vacuum suction pad. On the other hand, when the rear surface of the wafer is treated, since semiconductor devices formed on the main surface of the wafer must be prevented from being damaged, a grip chuck having three or more clamps for abutting the edge of the wafer is used. An example of the grip chucks is disclosed in Jpn. Pat. Appln. KOKOKU Publication No. 3-9607.

In the grip chucks, where the main surface of a wafer is directed downward, it is necessary to protect the main surface from a treatment liquid supplied to the rear surface (the upper surface). Similarly, when both surfaces of a wafer need to be cleaned, if the surfaces are consecutively cleaned, it is necessary to protect a first surface, which has been cleaned first, from the cleaning liquid for cleaning a second surface. For this purpose, in a conventional cleaning apparatus, a protecting gas (e.g., $N_2$ gas) is supplied to the lower surface of the wafer to prevent a cleaning liquid from flowing to the lower surface.

However, in the spin chucks, a driving mechanism for rotating a wafer, a clamp driving mechanism and a supplying mechanism for supplying a protecting gas must be arranged coaxial. Therefore, the structure is rendered complicated. In addition, since two driving sources are required, the apparatus is inevitably large in size.

SUMMARY OF THE INVENTION

The present inventors have proposed a novel structure to simplify the driving system of the treatment apparatus. In the structure, a wafer, i.e., a substrate to be treated, is held by using a pressure of a protecting gas. More specifically, the structure includes pistons movable forward and backward by means of the pressure of the protecting gas and swingable levers are connected to the distal ends of the pistons. The levers are swingable in directions in which a wafer is held and released. When the protecting gas is supplied to the structure, the pistons are moved forward by the pressure of the gas and the swingable levers connected to the pistons are swung in the direction in which the wafer is clamped. This structure does not require a driving source dedicated to a driving mechanism for clamping and releasing a wafer.

When a wafer is held on a rotating member, it is necessary to align the center of the wafer with the center of rotation. To prevent dislocation or so-called eccentricity, at least three clamps must be brought into contact with the edge of the wafer. It is preferable that four or more clamps be brought into contact with the edge of the wafer in order to assure satisfactory clamp force.

However, if a gas pressure is applied to pistons at respective operating positions through a single $N_2$ gas passage, driving force may not be uniformly applied to the pistons. In this case, the amounts of movement of swingable levers required for clamping a wafer cannot be uniform. As a result, a clamping or releasing operation cannot be performed satisfactorily. Unsatisfactory operations of the swingable levers influence not only in holding a wafer but also in positioning the wafer. In an extreme case, the wafer may be rattled and even damaged, when it is rotated.

It is accordingly an object of the present invention to provide a further improved spin chuck having a simple structure for uniformly transmitting driving force to means for clamping and releasing a wafer.

According to the present invention, there is provided a spin chuck comprising: a rotation shaft, having a supply passage extending in its axial direction, for supplying a protecting gas; a turn table supported by the rotation shaft; a supporting means which is provided on the turn table and on which a substrate to be treated is disposed; an opposing face provided on the turn table, for forming a space between itself and the substrate disposed on the supporting means; a movable member arranged in a path of the protecting gas for connecting the supply passage of the shaft and the space on the opposing face, the movable member being moved by receiving a flow of the protecting gas, in a direction parallel to a rotation axis of the turn table between an initial position where the protecting gas is not supplied and a working position where the protecting gas is supplied, the movable member having at least three working surfaces formed on its outside and tapered toward the working position; at least three reciprocating arms each extending from the movable member toward an edge of the substrate and supported by the turn table such that they can be reciprocated, the arms respectively having inner ends which abut against the working surfaces of the movable member; springs foe biasing the inner ends of the arms to the working surfaces of the movable member; at least three swingable levers arranged near the edge of the substrate and swingably supported by the turn table, each of the levers having first and second ends, the first end being connected to an outer end of one of the arms; and contact members respectively connected to the second ends of the levers, the contact members being brought into contact with and removed from the edge of the substrate in a range in which the levers are swingable, wherein, upon reception of protecting gas, the movable member is moved to the working position, the arms are pressed by the working surfaces of the movable member and moved outward, resulting in that the levees are swung so as to bring the contact members into contact with the edge of the substrate, and the substrate is clamped by the contact members.

According to the present invention, since the inner ends of the reciprocating arms are brought into contact with the movable member, all the reciprocating arms can be moved simultaneously in association with the change of the position of the movable member. The movable member is arranged so that it can open and close the passage of the protecting gas in accordance with the movement of its position. Thus, the supply of the protecting gas and the operation of the reciprocating arms can be simultaneously achieved by supplying the protecting gas to a single gas passage.

In order to optically detect whether the substrate to be treated is present or not, an optical sensor comprising a light emitting element and a light receiving element can be used. In this case, the light emitting and receiving elements are arranged on an extension line from the protecting gas supply passage of the shaft, such that they are opposed to each other with the turn table interposed therebetween. The members positioned between the light emitting and receiving elements, such as a top plate of the movable member and a guiding plate for guiding the protecting gas, are made of transparent material, so as to form an optical path of the optical sensor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a perspective view showing a cleaning apparatus according to an embodiment of the present invention;

FIG. 3 is a perspective view showing a movable member of the spin chuck shown in FIG. 2;

FIG. 4 is a plan view showing the spin chuck shown in FIG. 2;

FIG. 5 is an enlarged perspective view showing an engaging portion between the movable member and a reciprocation arm shown in FIG. 2;

FIG. 7 is a perspective view showing a modification of the spin chuck shown in FIG. 2;

FIGS. 8A and 8B are perspective views showing part of other modifications of the spin chuck shown in FIG. 2;

DETAILED DESCRIPTION OF THE PREFERRED EMBODIMENT

Figure 2:
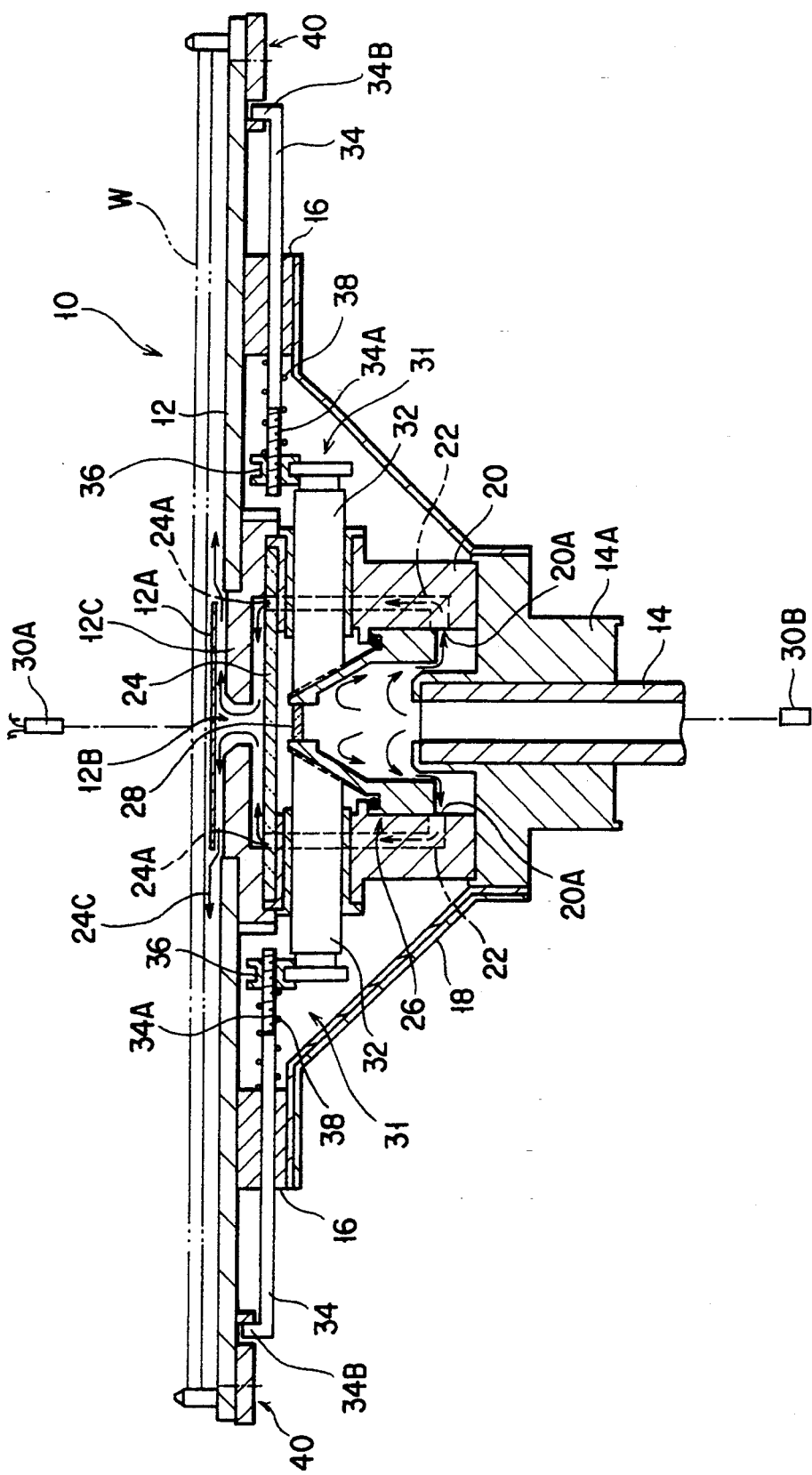
FIG. 2 is a cross-sectional view showing a spin chuck used in the apparatus shown in FIG. 1, taken along the line II—II in FIG. 4.

A cleaning apparatus according to an embodiment of the present invention as shown in FIG. 1 comprises a spin chuck 10, provided in a treatment chamber 5, for horizontally holding a wafer W or a substrate to be treated. The apparatus also comprises a jet nozzle 50 for supplying a treatment liquid (a pressurized cleaning liquid in this embodiment) to an upper surface of the wafer W held by the spin chuck 10. It further comprises a disk brush 60 for brushing and removing particles from the upper surface of the wafer W using the cleaning liquid.

The nozzle 50 is movable in directions X and Z shown in FIG. 1. The brush 60 is rotatably supported by an arm which 62 is movable in directions Z and $\theta$. Thus, the wafer W disposed on the chuck 10 is cleaned by the cleaning liquid supplied from the nozzle 50 and the particles adhered to the upper surface of the wafer W are removed by the movement and rotation of the brush 60.

As shown in FIG. 2, the spin chuck 10 has a turn table 12 integrally supported on a hollow shaft 14, which is rotated by driving means (not shown) such as a motor. The turn table 12 and the shaft 14 are fixed to each other via a supporting plate 18 which is fixed to a guide portion 16 for guiding an extension rod 34 (to be described later). The hollow portion of the shaft 14 serves as a passage of a protecting gas, for example, $N_2$ gas. The $N_2$ gas is introduced to the hollow portion of the shaft 14 through a pipe connected to a gas supply source (not shown) and discharged toward a lower surface of the wafer W through a supply passage 22 (to be described later).

A transparent guide plate 12A is interposed between a central portion of the turn table 12 and the wafer W. By virtue of this plate, the $N_2$ gas is not directly supplied to the lower surface of the wafer W but flows toward the edge of the wafer W. Since the $N_2$ gas is not directly applied to the lower surface of the wafer W, a semiconductor device forming surface of the wafer W is not damaged. In addition, the probability of particles in the $N_2$ gas being adhered to the wafer W is reduced.

A boss 14A fixed to an upper end portion of the shaft 14 is provided with a member for forming the supply passage 22. A cylindrical supporting core 20 is attached to an upper surface of the boss 14A. The supply passage 22 has a plurality of, for example, six openings 20A, which are positioned at a predetermined height from the lower end of the inner surface of the boss 14A. The supply passage 22 communicates with six openings 24A formed in the peripheral portion of a transparent plate 24. The transparent plate 24 is mounted on and fixed to the upper surface of the supporting core 20 and arranged so as to be opposed to the lower surface of the turn table 12 at a central portion thereof. The transparent plate 24, made of, e.g., vinyl chloride, forms a part of a light path used to detect whether the wafer W exists on the spin chuck 10. A gas discharging plate 12C having an opening 12B is arranged in a central portion of the turn table 12 between the guide plate 12A and the transparent plate 24.

A movable member 26 is provided in the supporting core 20 and can be moved upward and downward along the inner surface of the core. A movable member 26 formed of two or more parts can be used, if they perform the same operation at the same timing. The movable member 26 serves as a driver used to clamp and release the edge of the wafer W. The movable member 26 is arranged to cover an $N_2$ gas discharging port at the upper end of the shaft 14. The movable member 26 is formed of a material having a small sliding frictional resistance arising when it is slid upward due to an applied pressure of the $N_2$ gas. In this embodiment, the material of the movable member 26 is, for example, fluoroplastics or polyacetal such as Derlin (a trademark).

The movable member 26, as shown in FIG. 3, comprises a cylindrical sliding portion 26A engaged with the inner surface of the supporting core 20 and a hollow tapered portion 26B formed on the sliding portion 26A. The top of the tapered portion 26B is opened and a transparent plate 28 (FIG. 2) is fixed therein. A seal ring 26C, e.g., an O ring, is provided at an junction between the sliding portion 26A and the hollow tapered portion 26B, for the purpose of sealing and protecting the wafer from dust.

Since the top of the movable member 26 is closed by the transparent plate 28, only the lower end thereof is opened. Therefore, when the $N_2$ gas is supplied through the shaft 14, the movable member 26 is raised along the axial direction of the shaft 14, and when the gas supply is stopped, the member 26 is lowered. The uppermost position of the movable member 26 is defined, when the upper end of the sliding portion 26A of the movable member 26 is engaged with an inward projection formed on the inner surface of the supporting core 20.

A state, in which the movable member does not receive a pressure of the $N_2$ gas supplied through the shaft 14, is defined as an initial state of the movable member 26. In this state, the movable member 26 is disposed on the boss 14A and closes the openings 20A formed in the inner surface of the supporting core 20. Thus, as the movable member 26 rises and lowers, it opens and closes the openings 20A of the supply passage 22 which allow passage of the $N_2$ gas to the lower surface of the wafer.

The transparent plate 28 is made of vinyl chloride, like the aforementioned transparent plate 24. The transparent plates 28 and 24 constitute the light path between a light emitting element 30A arranged above the spin chuck 10 and a light receiving element 30B arranged under the spin chuck 10 and opposed to the light emitting element 30A. The light path is used to detect whether the wafer exists on the spin chuck.

Three reciprocation arms 31, each having a slidable member 32 and a extension rod 34, are arranged to face the tapered portion 26B of the movable member 26. The reciprocation arms 31 extend in radial directions of the wafer W. The slidable members 32, or the base portions of the reciprocation arms 31, are arranged at a plurality positions along the circumferential direction of the wafer W, so that they may not interfere the $N_2$ gas supply passage 22. The slidable members 32 are supported by the supporting core 20, so that they are slidable in the horizontal direction.

Figure 11:
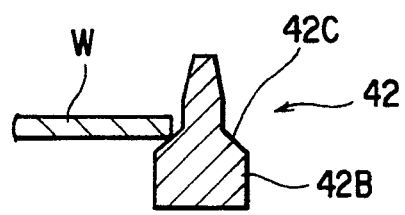
FIG. 11 is a cross-sectional view showing the relationship between a wafer and a pin of a restriction member of the spin chuck shown in FIG. 2.

As shown in FIG. 4, restriction members 42 to be engaged with the edge of the wafer W are fixed to the turn table 12 at positions which divide the circumference of the turn table 12 into three equal parts. Each restriction member 42 is constituted by a base 42A fixed to the turn table 12 and a tapered pin 42B to be engaged with the edge of the wafer W. The pin 42B is tapered so that the wafer W can be easily disposed on the turn table. The pin 42B has a conical step portion 42C as shown in FIG. 11, and can be engaged only with the edge of the wafer W at an inclined surface of the step portion 42C. The three slidable members 32 are arranged such that one is located between two restriction members 42. For example, to hold the wafer at six portions on the turn table, if at least three restriction members 42 are provided at portions of the turn table 12, the center of the wafer W can be determined. Therefore, each of the three slidable members 32 is arranged between two of the three portions at which the restriction members 42 are provided. If a sufficient pressure to clamp the wafer W is not obtained by the three slidable members 32, four or more slidable members can be used.

Each slidable member 32 is formed of a cylinder extending in a radial direction of the wafer W. The inner end of the slidable member 32 abuts against the tapered portion 26B of the movable member 26, and the outer end thereof is connected to an extension rod 34. The inner end of the slidable member 32 (which abuts against the tapered portion 26B of the movable member 26) has a U-shaped cross-section, as shown in FIG. 5. The inner end is engaged with two grooves 26D formed on the outer surface of the tapered portion 26B and extending in the axial direction of the movable member 26, to restrict a movement of the slidable member 32 in a circumferential direction. Thus, the slidable member 32 can be moved only in radial directions of the movable member 26 and cannot be removed from the movable member 26.

It is possible to form one groove on the movable member 26 in place of the two grooves 26D to be engaged with the inner end of each slidable member 32 and to form one projection on the inner end of the slidable member 32 so as to be engaged with the groove. It is also possible to make the inner end of the slidable member 32 curved in accordance with the curved surface of the tapered portion 26B of the movable member 26, so that it can abut against the tapered portion 26B, without a groove 26D.

The extension rod 34 transmits a movement of the slidable member 32, which is associated with the upward or downward movement of the movable member 26, to a swingable lever 40 (to be described later). The extension rod 34 has a screw 34A formed at an end thereof in a longitudinal direction, where the rod 34 is engaged with the slidable member 32. A connecting piece 36 is attached to the screw 34A. The connecting piece 36 is used to change the position at which the extension rod 34 is coupled with the slidable member 32, on the basis of a position at which the swingable lever 40 is coupled with the extension rod 34. A central portion of the extension rod 34 in the longitudinal direction is guided by a guide 16 fixed to the lower surface of the turn table 12.

A compression spring 38 is provided between the connecting piece 36 and the guide 16, so that the slidable member 32 is pressed against the tapered portion 26B of the movable member 26. Therefore, the slidable member 32 and the extension rod 34 can be moved in the longitudinal direction, i.e., a radial direction of the wafer W, in association with the upward or downward movement of the movable member 26.

The swingable lever 40, which is a clamping member for clamping or releasing the edge of a wafer W, is connected to the outer end of the extension rod 34. The swingable lever 40 can be swung on a horizontal plane about a fulcrum pin 40A fixed to the turn table 12. A clamp pin 40B, which can approach and be separated from the edge of a wafer W, is provided at an end of the swingable lever 40. The other end of the swingable lever 40 is coupled with a raised portion 34B (FIG. 2) of the extension rod 34. A notch 41 is formed in a portion of the turn table 12, within which the pin 40B is operable.

An operation of the spin chuck 10 will now be described.

When a process of cleaning a wafer W is initiated, the wafer W is transferred to the spin chuck by a fork-like transfer arm (not shown), which supports the marginal portion of the wafer W. The wafer W is transferred onto the turn table 12 from above by the arm and disposed on the conical step portions 42C of the pins 42B of the restriction members 42. The transfer arm and the turn table 12 are arranged not to interfere with each other when the wafer W is transferred.

Figure 6:
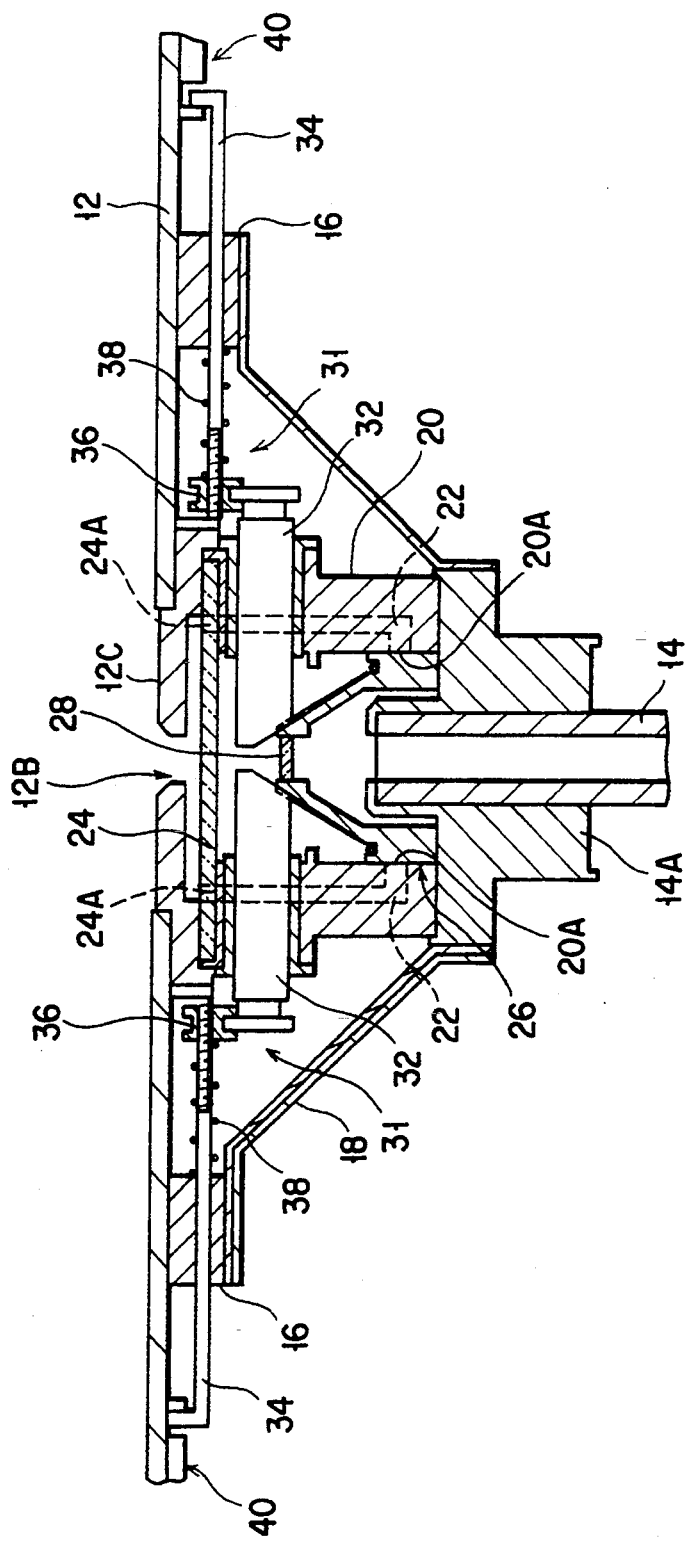
FIG. 6 is a cross-sectional view showing another state of the spin chuck shown in FIG. 2.

When the wafer W is placed on the spin chuck, the movable member 26 is set to the initial state. In this state, since the movable member 26 does not receive a pressure of $N_2$ gas supplied through the shaft 14, it is stationary at a lowered position, i.e., on the boss 14A. At this time, the slidable portion 26A closes the openings 20A of the $N_2$ gas supply passage 22, so as to shut off the $N_2$ gas to be supplied to the wafer W, as shown in FIG. 6.

After the wafer W is placed on the spin chuck, a gas supply source begins supplying the $N_2$ gas to the movable member 26 through the shaft 14. The gas supply starts upon detection of the wafer W by means of an optical sensor including the light emitting element 30A and the light receiving element 30B shown in FIG. 2. When the $N_2$ gas is discharged through the shaft 14, the pressure of the gas acts on the movable member 26. Accordingly, the movable member 26 is raised from the initial position (lowered position), thereby opening the openings 20A of the supply passage 22. As a result, the $N_2$ gas is discharged through the opening 12B of the gas discharging plate 12C, applied to the guide plate 12A, spread horizontally, and supplied to the lower surface of the wafer W.

While the pressure of the $N_2$ gas continues to act on the movable member 26, as the movable member 26 rises, the position of the tapered portion 26B in contact with the inner end of the slidable member 32 is changed. More specifically, part of the tapered portion 26B in contact with the inner end of the slidable member 32 has a diameter larger than that in the initial state. Accordingly, the movable members 32 move outward, i.e., toward the edge of the wafer W, against the biased force of the compression spring 38. As a result, the swingable levers 40 are swung by means of the extension rods 34 coupled with the slidable members 32, so that the clamp pins 40B are brought into contact with the edge of the wafer W to clamp the wafer W.

After the supply of the $N_2$ gas has started, the shaft 14 begins rotating. The timing of starting the rotation should be set to a time after the swing of the swingable levers 40 has been completed and the edge of the wafer W has been completely clamped, since it is necessary to take account of a period of time required to operate the movable member 26 by the flow of the $N_2$ gas and a period of time required to operate the slidable member 32 in association with the operation of the movable member 26.

When the edge of the wafer W is thus clamped by the swingable levers 40, the jet nozzle 50 shown in FIG. 1 is moved to a position opposed to the wafer W and the disk brush 60 also shown in FIG. 1 is brought into contact with the wafer W. Thus, a cleaning operation is initiated. The supply of the $N_2$ gas continues during the cleaning operation. The $N_2$ gas discharged through the openings 24A of the transparent plate 24 flows to the lower surface of the wafer W, as indicated by an arrow 24C. Since the $N_2$ gas continues to flow toward the edge of the wafer due to centrifugal force, the cleaning liquid is prevented from flowing to the lower surface of the wafer W.

When the cleaning operation is completed, the rotation of the shaft 14 is stopped first. Then, the supply of the $N_2$ gas is ceased. When the pressure of the $N_2$ gas on the movable member 26 is eliminated, the movable member 26 returns to the initial state. In this state, the openings 22A of the supply passage 22 are closed. The part of the tapered portion 26B in contact with the inner end of the slidable member 32 is changed to one portion having a diameter smaller than that in the cleaning operation. Accordingly, the slidable member 26 and the extension rod 34 are moved toward the center of the wafer W by the biased force of the compression spring 38. As a result, the swingable levers 40 are swung, in a direction in which the clamp pins 40B are removed from the edge of the wafer W to release the wafer W.

As described above, according to the present invention, the movable member 26 is set so as to abut against all the slidable members 32 with the same force. In other words, it is possible to move all the slidable members 32 in the same amount of distance simply by moving the movable member 26 in the axial direction of the shaft 14. The slidable members 32 need not be very long, since the function thereof is to convert the vertical movement of the movable member 26 to a horizontal movement and adjust the effective length of the extension rods 34. Most of the distance between the movable member 26 and each swingable lever 40 can be occupied by the extension rod 34, the weight of the entire spin chuck 10 can be reduced. Accordingly, the inertia moment of the spin chuck 10 which acts on the shaft 14 can be reduced.

In the above embodiment, the restriction member 42 having the pin 42B fixed to the turn table 12 is used as a structure for holding the edge of the wafer W. However, the restriction member 42 can be replaced by any member in accordance with the shape of a wafer W.

A type of wafer W has a linear portion in its circumference, or a so-called orientation flat. If this type of wafer is subjected to cleaning, the restriction member 42 can be replaced by a cylindrical pin which can be brought into contact with the orientation flat.

Another type of wafer W has a v-shaped or semicircular notch having a depth of about 1 mm from the edge of the wafer, instead of the orientation flat. This type of wafer is utilized to increase the area of a semiconductor device forming region on the wafer. In this case, it is possible to use a restriction member 44, as shown in FIGS. 7, 8A and 8B, which has a shape of, for example, triangular pyramid, circular cylinder or rectangular prism, and which can be engaged with the notch and allows the wafer W to be easily transferred onto the turn table.

If the wafer having a notch in its edge portion is to be cleaned by the cleaning apparatus, the notch should be aligned with the restriction member 44. For this purpose, notch position detecting means, such as a light transmission-type optical sensor (not shown) can be provided in the cleaning apparatus. The position detecting means drives a driver for moving the shaft 14, thereby aligning the notch with the restriction member 44.

In the above embodiment, the brush serving as a cleaning member is brought into contact with the wafer W to brush particles off the upper surface thereof. However, it is possible to employ a structure as shown in FIGS. 9 and 10, in which a cleaning member is not brought into direct contact with the wafer W.

Figure 9:
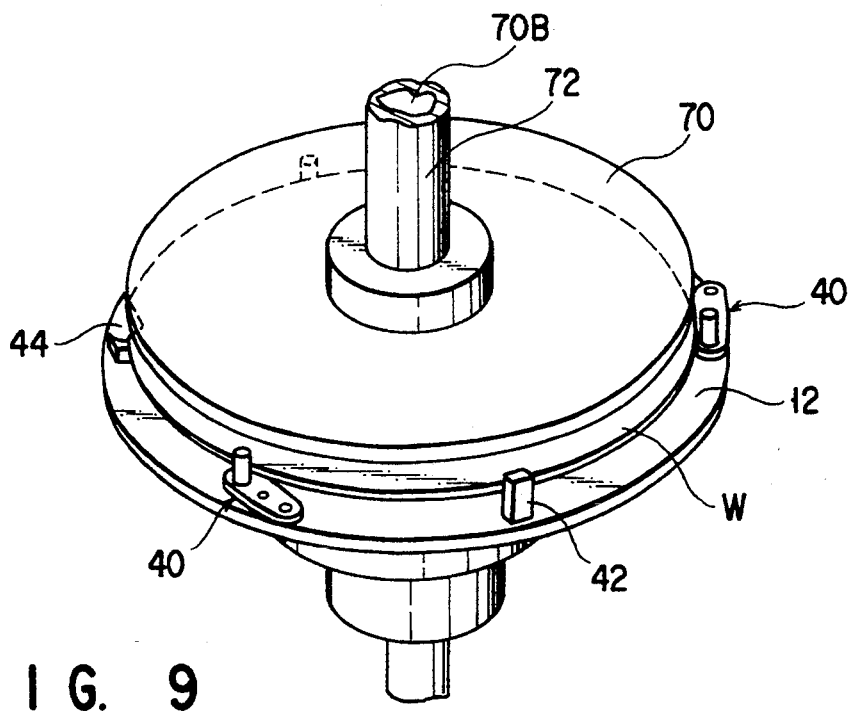
FIG. 9 is a perspective view showing part of a cleaning apparatus according to another embodiment of the present invention.
Figure 10:
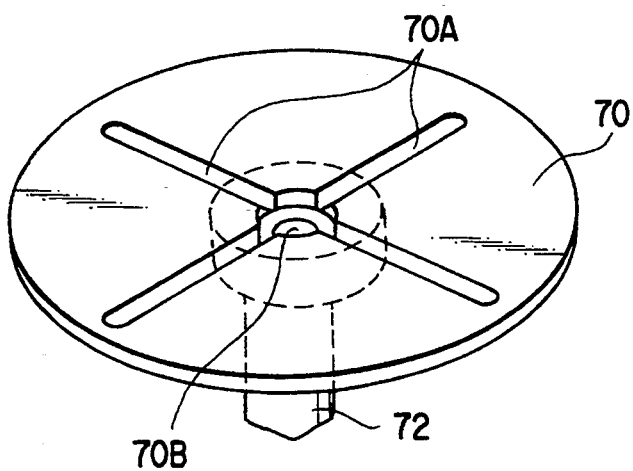
FIG. 10 is a perspective view showing a cleaning member used in the apparatus shown in FIG. 9.

In the structure shown in FIGS. 9 and 10, a rotatable disk-shaped cleaning member 70 is arranged above the wafer W disposed on a turn table 12. The cleaning member 70 is opposed to the wafer W with a distance, for example, 500 to 1000 μm. It is preferable that the distance should be determined so as not to cause a cleaning liquid or water to scatter. The cleaning member 70 has a recess 70A, constituted by crossed grooves, on a surface opposed to the wafer W, as shown in FIG. 10. The recess 70A is, for example, 2 to 5 mm wide and 0.5 to 5 mm deep. A central portion of the crossed grooves constituting the recess 70A communicate with a cleaning liquid supply passage 70B formed in a shaft 72. Thus, when the cleaning liquid supplied through the passage 70B enters the recess 70A, it spreads in the radial directions due to the centrifugal force generated by rotation of the cleaning member 70. The cleaning liquid is retained in the recess 70A by the surface tension and forms a cleaning liquid film between the wafer W and the cleaning member 70. Particles adhered to the wafer W are absorbed by the liquid film and removed from the wafer. Where the cleaning liquid is to be diffused radially outward utilizing the centrifugal force, the shape of the recess 70A may be changed and the speed of the flow of the cleaning liquid may be increased, such that the diffused and jet cleaning liquid is caused to be inclined with respect to the wafer W, and the efficiency of removing particles adhered on the wafer W is increased. Further, the rotating direction of the cleaning member 70 can be set opposite to that of the wafer W, thereby improving the efficiency of removing particles from the wafer W.

The size of the cleaning member 70 need not correspond to the configuration of the wafer W, but can be smaller than the wafer W. In this case, the cleaning member 70 is rotated and revolved on the wafer or moved across the wafer W.

According to this embodiment, since the cleaning member 70 can be formed of metal or resin, it is possible to reduce the frequency of exchange of the cleaning member 70 or it is unnecessary to remove particles adhered to the cleaning member 70. In addition, where a brush made of nylon or mohair is used, particles removed from the wafer may remain on the brush itself and readhere to the wafer W or damage a semiconductor device forming surface. This drawback can be eliminated by the cleaning member of this embodiment.

Besides the semiconductor wafer as described above, an LCD substrate, a printed board, a photomask, a ceramic substrate and a compact disk can be treated by an apparatus according to the present invention.

Further, the present invention can be applied not only to a cleaning apparatus but also to any type of apparatus in which a treatment liquid is supplied to the upper surface of a rotating substrate to be treated, such as a photoresist developing apparatus and an etching apparatus.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A spin chuck comprising:
   a rotation shaft, having a supply passage extending in its axial direction, for supplying a protecting gas;
   a turn table supported by the rotation shaft;
   a supporting means which is provided on the turn table and on which a substrate to be treated is disposed;
   an opposing face provided on the turn table, for forming a space between itself and the substrate disposed on the supporting means;
   a movable member arranged in a path of the protecting gas for connecting the supply passage of the shaft and the space on the opposing face, the movable member being moved by receiving a flow of the protecting gas, in a direction parallel to a rotation axis of the turn table between an initial position where the protecting gas is not supplied and a working position where the protecting gas is supplied, the movable member having at least three working surfaces formed on its outside and tapered toward the working position;
   at least three reciprocating arms each extending from the movable member toward an edge of the substrate and supported by the turn table such that they can be reciprocated, the arms respectively having inner ends which abut against the working surfaces of the movable member;
   springs for biasing the inner ends of the arms to the working surfaces of the movable member;
   at least three swingable levers arranged near the edge of the substrate and swingably supported by the turn table, each of the levers having first and second ends, the first end being connected to an outer end of one of the arms; and
   contact members respectively connected to the second ends of the levers, the contact members being brought into contact with and removed from the edge of the substrate in a range in which the levers are swingable,
   wherein, upon reception of protecting gas, the movable member is moved to the working position, the arms are pressed by the working surfaces of the movable member and moved outward, resulting in that the levers are swung so as to bring the contact members into contact with the edge of the substrate, and the substrate is clamped by the contact members.

2. The spin chuck according to claim 1, wherein the movable member closes the path of the protecting gas in the initial position, and opens it in the working position.

3. The spin chuck according to claim 2, wherein the movable member has a conical shape having an open bottom and covers an open end of the shaft communicating with the supply passage.

4. The spin chuck according to claim 1, wherein the working surfaces of the movable member are respectively engaged with the inner ends of the arms by sets of a groove extending in a direction in which the movable member moves and a projection inserted in the grooves, thereby restricting a relative movement of the movable member and the arms in a direction across the grooves.

5. The spin chuck according to claim 1, further comprising at least three restriction members fixed to the turn table, for being engaged with the edge of the substrate.

6. The spin chuck according to claim 5, wherein the supporting means comprises a plurality of mounting sections arranged on the turn table along the edge of the substrate.

7. The spin chuck according to claim 6, wherein each of the restriction members comprises an inclined plane inclined toward a center of the turn table and each of the mounting sections is formed of a part of the inclined plane.

8. The spin chuck according to claim 6, wherein the contact members are arranged at substantially regular intervals and each of the restriction members is arranged between two adjacent contact members.

9. The spin chuck according to claim 6, wherein the substrate has a notch on its edge and one of the restriction members is engaged with the notch.

10. The spin chuck according to claim 1, wherein each of the reciprocating arms comprises a first member engaged with the movable member and a second member connected to one of the levers, and the first and second members are connected to each other by a screw portion, so that the length of the reciprocating arm can be changed.

11. A treatment apparatus comprising:
(a) a spin chuck comprising,
a rotation shaft, having a supply passage extending in its axial direction, for supplying a protecting gas,
a turn table supported by the rotation shaft,
a supporting means which is provided on the turn table and on which a substrate to be treated is disposed,
an opposing face provided on the turn table, for forming a space between itself and the substrate disposed on the supporting means,
a movable member arranged in a path of the protecting gas for connecting the supply passage of the shaft and the space on the opposing face, the movable member being moved by receiving a flow of the protecting gas, in a direction parallel to a rotation axis of the turn table between an initial position where the protecting gas is not supplied and a working position where the protecting gas is supplied, the movable member having at least three working surfaces formed on its outside and tapered toward the working position,
at least three reciprocating arms each extending from the movable member toward an edge of the substrate and supported by the turn table such that they can be reciprocated, the arms respectively having inner ends which abut against the working surfaces of the movable member,
springs for biasing the inner ends of the arms to the working surfaces of the movable member,
at least three swingable levers arranged near the edge of the substrate and swingably supported by the turn table, each of the levers having first and second ends, the first end being connected to an outer end of one of the arms, and
contact members respectively connected to the second ends of the levers, the contact members being brought into contact with and removed from the edge of the substrate in a range in which the levers are swingable,
wherein, upon reception of protecting gas, the movable member is moved to the working position, the arms are pressed by the working surfaces of the movable member and moved outward, resulting in that the levers are swung so as to bring the contact members into contact with the edge of the substrate, and the substrate is clamped by the contact members; and
(b) liquid supply means for supplying a treatment liquid onto the substrate.

12. The apparatus according to claim 11, further comprising a substrate detecting means for optically detecting whether the substrate is present or not on the spin chuck.

13. The apparatus according to claim 12, wherein the substrate detecting means comprises a light emitting element and a light receiving element opposing to each other with the turn table interposed therebetween and arranged on an extension line from the supply passage of the rotation shaft, wherein members located between the light emitting element and the light receiving element are formed of transparent material.

14. The apparatus according to claim 11, wherein the movable member closes the path of the protecting gas in the initial position, and opens it in the working position.

15. The apparatus according to claim 11, wherein the working surfaces of the movable member are respectively engaged with the inner ends of the arms by sets of a groove extending in a direction in which the movable member moves and a projection inserted in the groove, thereby restricting a relative movement of the movable member and the arms in a direction across the grooves.

16. The apparatus according to claim 11, further comprising at least three restriction members fixed to the turn table, for being engaged with the edge of the substrate.

17. The apparatus according to claim 11, wherein each of the reciprocating arms comprises a first member engaged with the movable member and a second member connected to one of the levers, and the first and second members are connected to each other by a screw portion, so that the length of the reciprocating arm can be changed.

18. The apparatus according to claim 11, further comprising a brush foe brushing the substrate clamped by the spin chuck, wherein the liquid supply means comprises a nozzle for supplying a cleaning liquid.

19. The apparatus according to claim 18, further comprising:
means for moving the brush between a working position above the spin chuck and a retreat position apart from the spin chuck; and
means for moving the nozzle between a working position above the spin chuck and a retreat position apart from the spin chuck.

20. The apparatus according to claim 11, wherein the liquid supply means comprises a cleaning member for supplying a cleaning liquid, the cleaning member having a working surface opposing to the substrate clamped by the spin chuck with a cleaning space provided therebetween and a cleaning liquid supplying path for introducing the cleaning liquid into the cleaning space, and wherein the cleaning space is defined such that a film made of the cleaning liquid is formed therein.

* * * * *